United States Patent [19]
Derry et al.

[11] Patent Number: 5,189,679
[45] Date of Patent: Feb. 23, 1993

[54] STRAINED QUANTUM WELL LASER FOR HIGH TEMPERATURE OPERATION

[75] Inventors: Pamela L. Derry, Renton; Chi-Shain Hong, Bellevue; Eric Y. Chan, Mercer Island; Luis Figueroa, Bellevue, all of Wash.; R. Jennhwa Fu, Mendham, N.J.

[73] Assignee: The Boeing Company, Seattle, Wash.

[21] Appl. No.: 756,193

[22] Filed: Sep. 6, 1991

[51] Int. Cl.[5] .................................................. H01S 3/19
[52] U.S. Cl. .......................................... 372/45; 372/46
[58] Field of Search .................................. 372/115, 46

[56] References Cited

U.S. PATENT DOCUMENTS 4,961,197  10/1990  Tanaka et al. ......................... 372/45

OTHER PUBLICATIONS

Fukagai et al., "Current Density Dependence for Dark-Line Defect Growth Velocity in Strained InGaAs-/AlGaAs Quantum Well Laser Diodes," *Japanese Journal of Applied Physics*, vol. 30, No. 3A, Mar. 1991, pp. 371-373.
Hess et al., "Temperature Dependence of Threshold Current for a Quantum-Well Heterostructure Laser," *Solid-State Electronics*, vol. 23, pp. 585-589, 1980.
Okayasu et al., "Stable Operation (Over 5000 h) of High-Power 0.98-$\mu$m InGaAs-GaAs Strained Quantum Well Ridge Waveguide Lasers for Pumping $Er^{3+}$-Doped Fiber Amplifiers," *IEEE Photonics Technology Letters*, vol. 2, No. 10, Oct. 1990, pp. 689-691.
Temkin et al., "High Temperature Operation of Lattice Matched and Strained InGaAs-InP Quantum Well Lasers," *IEEE Photonics Technology Letters*, vol. 3, No. 2, Feb. 1991, pp. 100-102.
Thijs et al., "High Temperature Operation of =1·$\mu$m Tensile Strained Multiple Quantum Well SIPBH Lasers," *Electronics Letters*, May 9, 1991, vol. 27, No. 10, pp. 791-793.
Thijs et al., "High Quantum Efficiency, High Power, Modulation Doped GainAs Strained-Layer Quantum Well Laser Diodes Emitting as 1·5 $\mu$m," *Electronics Letters*, Dec. 7, 1989, vol. 25, No. 25, pp. 1735-1737.
van der Ziel et al., "High-Temperature Operation (to 180° C.) of 0.98 $\mu$m Strained Single Quantum Well $In_{0.2}Ga_{0.8}As$/GaAs Lasers," *Applied Physics Letters*, vol. 58, No. 13, Apr. 1, 1991, pp. 1437-1439.
Waters et al., "Inhibited Dark-Line Defect Formation in Strained InGaAs/AlGaAs Quantum Well Lasers," *IEEE Photonics Technology Letters*, vol. 2, No. 8, Aug. 1990, pp. 531-533.
Waters et al., "The Influence of In on the Performance of (Al)GaAs Single Quantum Well Lasers," *SPIE-Laser Diode Technology and Applications*, vol. 1043, 1989, pp. 310-317.
Yellen et al., "20 000 h InGaAs Quantum Well Lasers," *Electronics Letters*, Oct. 12, 1990, 2 pages.
Zhu et al., "Temperature Dependence of Optical Gain, Quantum Efficiency, and Threshold Current in GaAs/GaAlAs Graded-Index Separate-Confinement Heterostructure Single-Quantum-Well Lasers," *Journal of Quantum Electronics*, vol. 25, No. 9, Sep. 1989, pp. 2007-2012.
Zory et al., "Anomalous Temperature Dependence of Threshold for Thin Quantum Well AlGaAs Diode Lasers," *Applied Physics Letters*, vol. 49, No. 1, Jul. 7 1986, pp. 16-18.

*Primary Examiner*—Georgia Y. Epps
*Attorney, Agent, or Firm*—Christensen, O'Connor, Johnson & Kindness

[57] ABSTRACT

A semiconductor laser having increased reliability and enhanced high temperature operation. The device is based upon GaAs/AlGaAs, and comprises a quantum well active layer that is strained by the inclusion of the indium. The rear facet of the device has a high reflectivity coating, and the front facet reflectivity and cavity length are adjusted based upon the required output power. For high output power at high temperature, long cavity lengths and low front facet reflectivities are used. For low current operation and low output power at high temperature, shorter cavities and higher front facet reflectivities are used. The lasers are capable of reliably operating at temperatures up to and in excess of 100° C.

11 Claims, 12 Drawing Sheets

STRAINED QUANTUM WELL LASER FOR HIGH TEMPERATURE OPERATION

FIELD OF THE INVENTION

The present invention relates to semiconductor lasers and, in particular, to a gallium arsenide (GaAs) based semiconductor laser that has high reliability and that is well suited for high temperature operation.

BACKGROUND OF THE INVENTION

The significant temperature sensitivity of semiconductor lasers limits their use in high temperature environments, such as those often encountered in aerospace and military applications. Even in a stable temperature environment, heating due to the operation of a semiconductor laser can produce enough temperature increase to affect laser performance. To avoid heating problems, a thermoelectric cooler is often packaged with a semiconductor laser. However, this approach increases the size, power consumption, and weight of the device. In addition, commercially available thermoelectric coolers are not certified for long term reliability, or for use in environments subject to vibration. The inclusion of a thermoelectric cooler can therefore reduce the reliability of a semiconductor laser device.

It has previously been appreciated that the heating that occurs during operation of a semiconductor laser can be reduced by lowering the threshold current density of the device. For gallium arsenide (GaAs) based semiconductor lasers, it has also been noted that designs with quantum well active layers have high temperature characteristics that are superior to those that use more conventional (bulk) active layer designs. However, there has been a large variation in the results obtained by different workers on this point. Finally, it has also been noted that for quantum well, gallium arsenide based lasers, straining the active layer can produce an increase in the reliability of the device and lower threshold current densities. However, it has previously been unclear how these different observations were interrelated, and how they could be used to produce more reliable semiconductors lasers.

SUMMARY OF THE INVENTION

For semiconductor lasers, temperature sensitivity appears to have some inherent correlation to reliability. For example, semiconductor lasers have shorter lifetimes at higher temperatures, and laser reliability tests are therefore often carried out at elevated temperatures. If such a test causes a laser to fail suddenly or degrade substantially, then the laser cannot be expected to be reliable at room temperature. The correlation between high temperature operation and reliability may be related to the heating that laser operation produces.

The present invention exploits this link between reliability and high temperature operation, and provides semiconductor lasers having increased reliability by minimizing the temperature dependence of the laser. In particular, lasers according to the present invention minimize the degree to which laser operating parameters, such as threshold current density, vary as the temperature changes. In a preferred environment, this is achieved by employing a gallium arsenide active region comprising an indium gallium arsenide quantum well, and by placing a high reflectivity coating on the back facet. Preferably, the front facet reflectivity is made as high as possible, consistent with the required optical output power from the laser. If the front facet reflectivity must be lowered to provide the necessary power, then a reliable, high temperature device may nevertheless be produced by using relatively long cavity lengths.

DETAILED DESCRIPTION OF THE PREFERRED EMBODIMENTS

A principal objective of the present invention is to create a semiconductor laser having reduced temperature dependence, i.e., a semiconductor laser whose operating characteristics are relatively invariant with temperature, as compared to a conventional semiconductor laser. Reduced temperature dependence is desirable not only for high temperature operation, but also for increased reliability at more conventional temperatures, as previously discussed. In general, applicants have discovered that a semiconductor laser with reduced temperature dependence can be produced in a GaAs system by using a quantum well in the active region, by straining the active region by inclusion of indium in the crystal lattice, by placing a high reflectivity coating on the rear facet of the laser cavity, and by selecting particular combinations of cavity length and front facet reflectivity. The theoretical and experimental bases for selecting this particular combination of factors are discussed below. However to make the discussion more concrete, particular semiconductor lasers in which the invention may be practiced will first be described.

Figure 1:
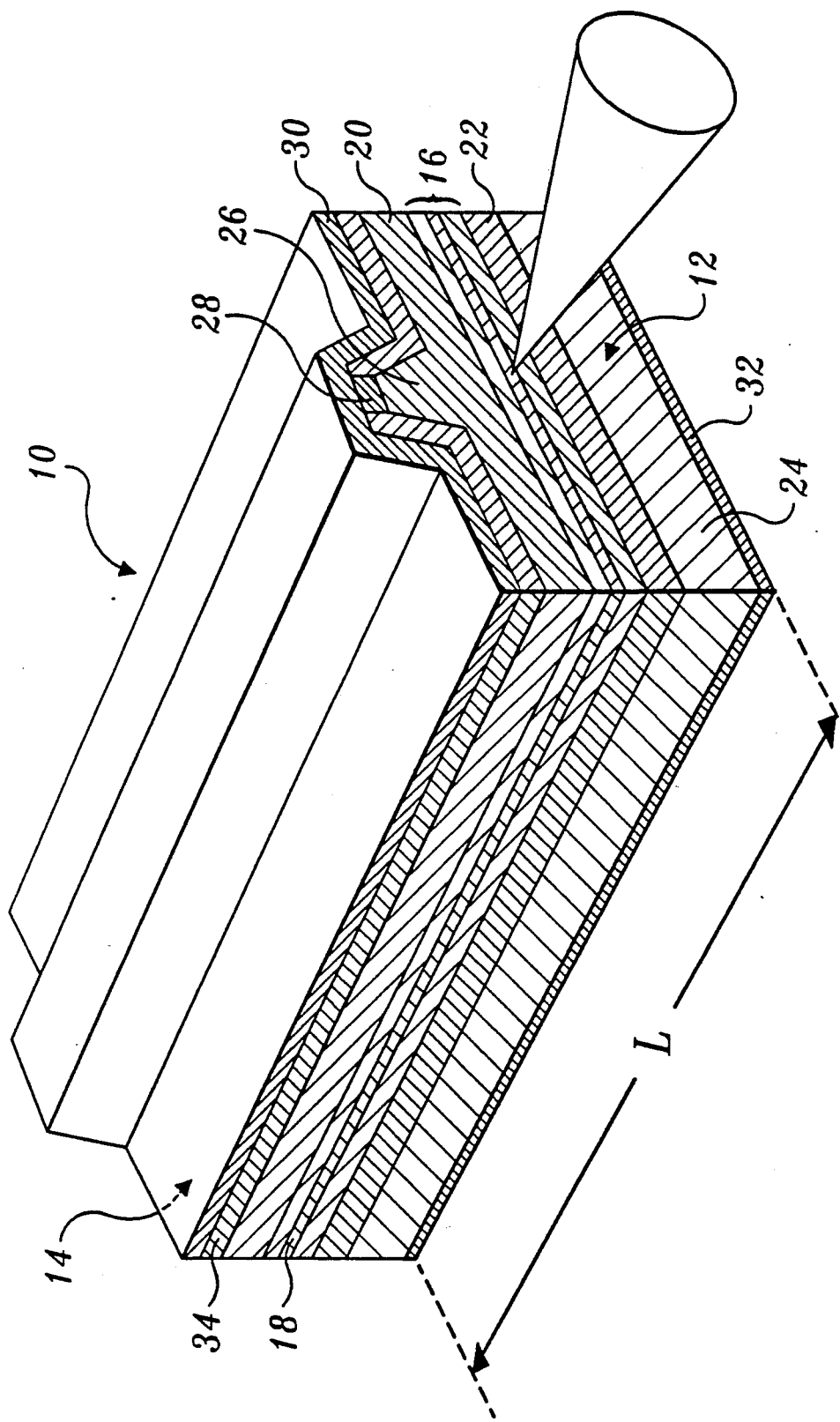
FIG. 1 is a schematic, perspective view showing the epitaxial structure of a ridge waveguide laser diode in which the present invention may be implemented.

One such laser is schematically illustrated in FIG. 1. The laser comprises a layered semiconductor structure 10 of length L having front face or facet 12 and rear facet 14. The structure comprises active region 16 that includes quantum well 18. The structure of the active region is further described below. The active region is surrounded by upper cladding layer 20 formed from p AlGaAs, and lower cladding layer 22 formed from n AlGaAs, the lower cladding layer being supported on substrate 24 that is formed from n+GaAs. Upper cladding layer 20 includes a ridge-shaped portion 26 on which p+GaAs contact layer 28 is formed. Ridge-shaped portion 26 forms a wave guide for the laser light. Electrodes 30 and 32 are formed on the upper and lower surfaces of structure 10, with electrode 30 being isolated from cladding layer 20 by silicon nitride dielectric layer 34.

Figure 2:
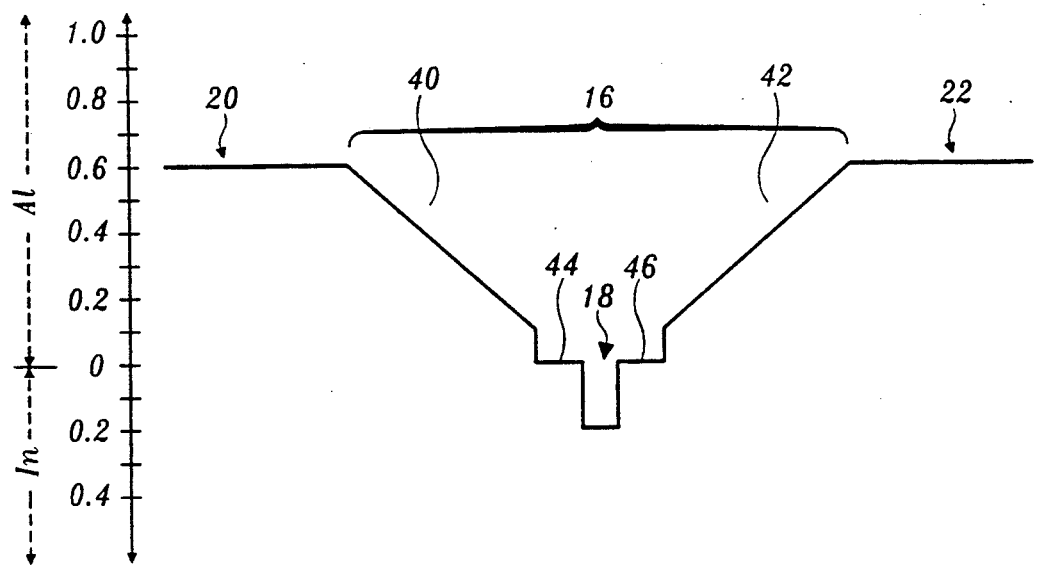
FIG. 2 is a composition diagram of the cladding layers and active region.

The active region and cladding layers are further illustrated in FIG. 2. Active region 16 comprises AlGaAs GRINSCH layers 40 and 42, GaAs spacer layers 44 and 46, the GRINSCH and spacing layers being symmetrically positioned on opposite sides of quantum well 18 that comprises InGaAs. As illustrated by the graph on the left-hand portion of FIG. 2, cladding layers 20 and 22 have an aluminum fraction of 0.6, GRINSCH layers 40 and 42 have an aluminum fraction that varies from 0.6 to 0.1, and quantum well 18 has an indium fraction of 0.2. Spacer layers 44 and 46 contain neither aluminum nor indium. Suitable thicknesses for quantum well 18 are 60-100 Å, and suitable thicknesses for the spacing layers are 50-100 Å. The presence of indium in quantum well 18 causes the quantum well to be strained, which enhances the high temperature operation of the device, as further described below.

Figure 3:
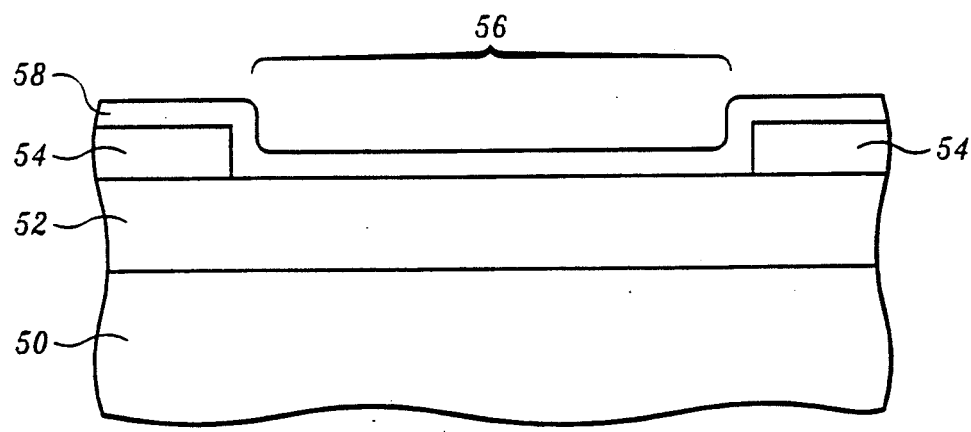
FIG. 3 is a partial schematic view of the epitaxial structure of a broad area type laser diode in which the present invention may be implemented.

FIG. 3 is a partial, schematic illustration of an alternate construction for a semiconductor laser that has been used herein primarily for proof of concept. In FIG. 3, reference numeral 50 designates the upper cladding layer for the device, the layers lying below the upper cladding layer being identical to those shown in FIG. 1. Contact layer 52 is positioned on top of cladding layer 50. Dielectric layer 54 is positioned on the contact layer, the dielectric layer including a gap 56. Electrode 58 overlies the dielectric layer and the contact layer within gap 56. Width 56 defines the area through which current may flow from electrode 58, and thus essentially defines the width of the optical cavity. A suitable dimension for width 56 is fifty microns. The embodiment of FIG. 3 is referred to as a "broad area" device, as opposed to the "ridge waveguide" device illustrated in FIG. 1.

Semiconductor lasers of the type illustrated in FIGS. 1-3 were produced by conventional low pressure (70 Torr) metal-organic chemical vapor deposition (MOCVD), on an n+GaAs substrate. The InGaAs and GaAs layers were grown at 610° C. using trimethylgallium, trimethylaluminum, trimethylindium and arsine. The AlGaAs layers were grown at 750° C. Hydrogen selenide and diethylzinc were used for the n- and p-type dopants, respectively. The thickness of GRINSCH layers 40 and 42 was 0.2 microns, and the thickness of the cladding layers was 1.25 microns, and the thickness of the contact layer was 0.1 microns. The ridge of the ridge waveguide device of FIG. 1 was fabricated by etching in a $H_2SO_4:H_2O_2:H_2O$ solution for a depth of 1.2 to 1.3 microns. This corresponds to a 0.3 micron distance from the quantum well. The effective index step was estimated to be about $10^{-3}$. Individual laser chips were then bonded directly onto a copper heatsink using a PbSnAg eutetic solder.

Figure 4:
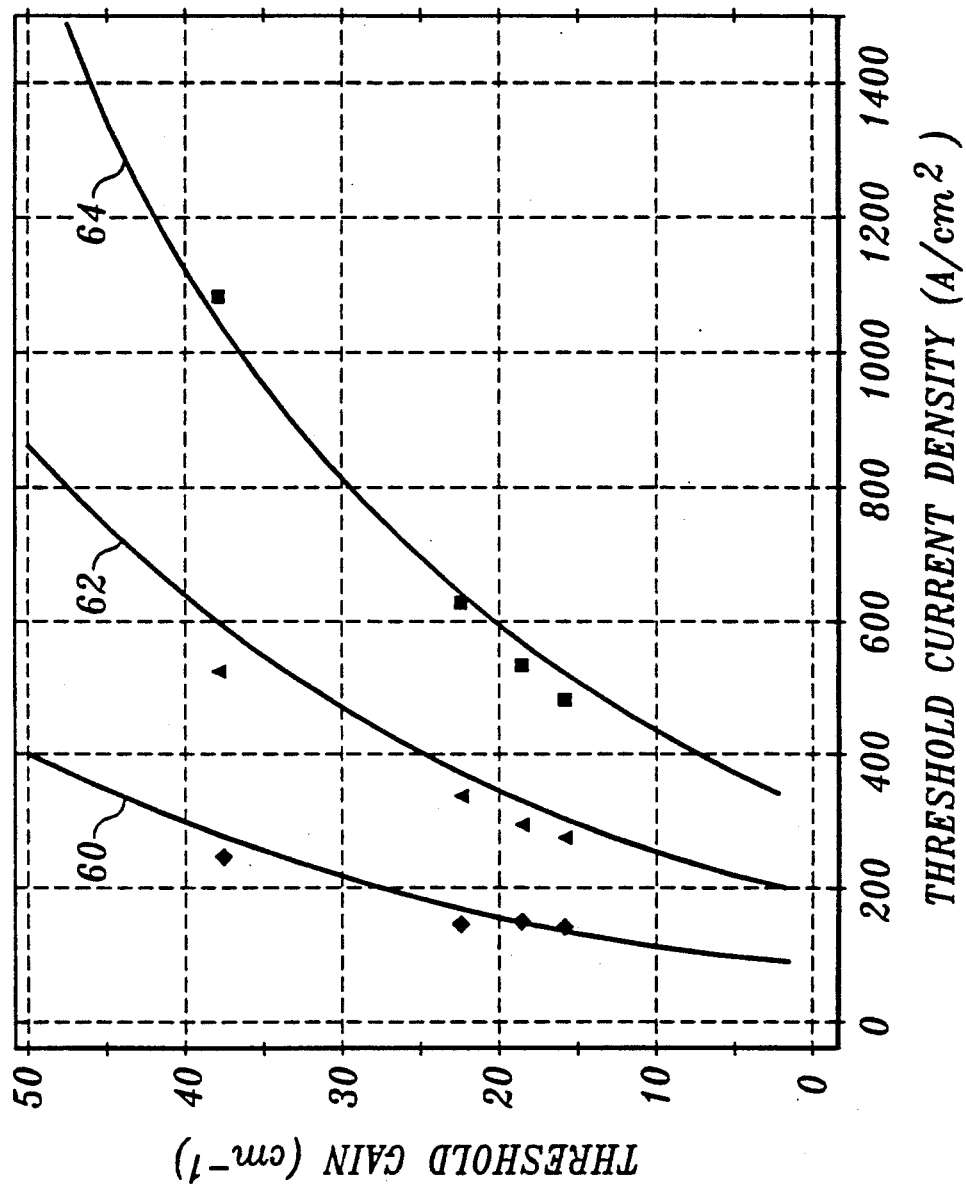
FIG. 4 is a graph illustrating the relationship between threshold gain and threshold current density.

FIG. 4 presents both theoretical and experimental data illustrating the relationship between threshold gain, threshold current density and temperature for broad area semiconductor lasers of the type illustrated in FIGS. 2 and 3, having a 60 Å quantum well comprising 15% indium, operated in a pulsed (as opposed to continuous wave) manner. Curves 60, 62 and 64 represent the theoretical relationship at temperatures of 20° C., 100° C. and 160° C., respectively. This relationship was derived by calculating the threshold gain and current density as functions of threshold carrier density and temperature. Current density for a semiconductor laser is inversely proportional to the internal quantum efficiency, i.e., the number of photons generated per electron. The internal quantum efficiency decreases as the temperature increases. For example, for the lasers described here, the internal quantum efficiency is approximately 0.9 at 20° C., and decreases linearly to approximately 0.55 at 160° C. The internal quantum efficiency of a laser is one of the primary parameters involved in determining the light output by the device. Therefore, in order to make the model as accurate as possible, the internal quantum efficiency temperature dependence was included as an empirical expression (based on experimental measurement) in calculating curves 60, 62 and 64. The model does not include heating that would occur during continuous operation.

In addition to the theoretical results, four experimental data points have been plotted for each curve in FIG. 4, i.e., for each temperature. The three data points at a threshold current gain of about 37 cm$^{-1}$ were obtained for lasers in which the length L of the laser cavity (see FIG. 1) was 400 microns. The curves at a threshold gain of about 22 cm$^{-1}$ were obtained using 800 microns cavities. The remaining two groups of three data points were obtained using 1200 and 1600 microns cavities, respectively.

Two important insights can be drawn from FIG. 4. First, to minimize the variation in threshold current density with temperature, the threshold gain should be selected to be as small as possible. Stated differently, curves 60, 62, and 64 are closer to one another at lower threshold gains than at higher threshold gains. Second, while typical cavity lengths for semiconductor lasers are on the order of 200-400 microns, FIG. 4 suggests that one way to lower the threshold gain is to increase the length of the laser cavity beyond lengths conventionally used, e.g., to lengths of 600 microns or more.

The threshold gain $g_{th}$ of a semiconductor laser (per unit length) is equal to the total optical losses of the laser:

$$g_{th} = \alpha_i + (1/2L) \ln (1/R_F R_R) \qquad (1)$$

where $\alpha_i$ is the internal loss per unit distance, L is the laser cavity length, $R_F$ is the front facet reflectivity, and $R_R$ is the rear facet reflectivity. Equation 1 indicates that there are three general approaches to reducing the threshold gain of a semiconductor laser: decreasing the internal loss parameter $\alpha_i$; increasing the cavity length L; and increasing the reflectivities $R_F$ and $R_R$. The present invention is primarily concerned with the second and third options. The parameter $\alpha_i$ is determined by the quality of the epitaxial growth of the quantum well structure. For devices modeled here, $\alpha_i$ is about 8 cm$^{-1}$, and will be treated as a given quantity not subject to further improvement. However, it should be kept in mind that any techniques that reduce $\alpha_i$ without affecting other laser parameters will lower the threshold gain, and thereby decrease the temperature sensitivity of the device.

The reflectivity of an uncoated cleaved facet of a gallium arsenide crystal is about 32%, but this reflectivity can be substantially increased through the use of high reflectivity dielectric coatings. Suitable dielectric coatings are quarter wavelength stacks of $Al_2O_3$ or $Ti_2O_3$ and Si or $SiO_2$. For laser diodes in accordance with the present invention, the rear facet should have a high reflectivity coating, i.e., a coating having a reflectivity of at least 80%, and preferably 95% or higher. With respect to the front facet reflectivity, however, there is a significant tradeoff involved in increasing its reflectivity. In particular, an increase of the front facet reflectivity will reduce the threshold gain, but will also reduce the amount of light available as output.

Figure 5A:
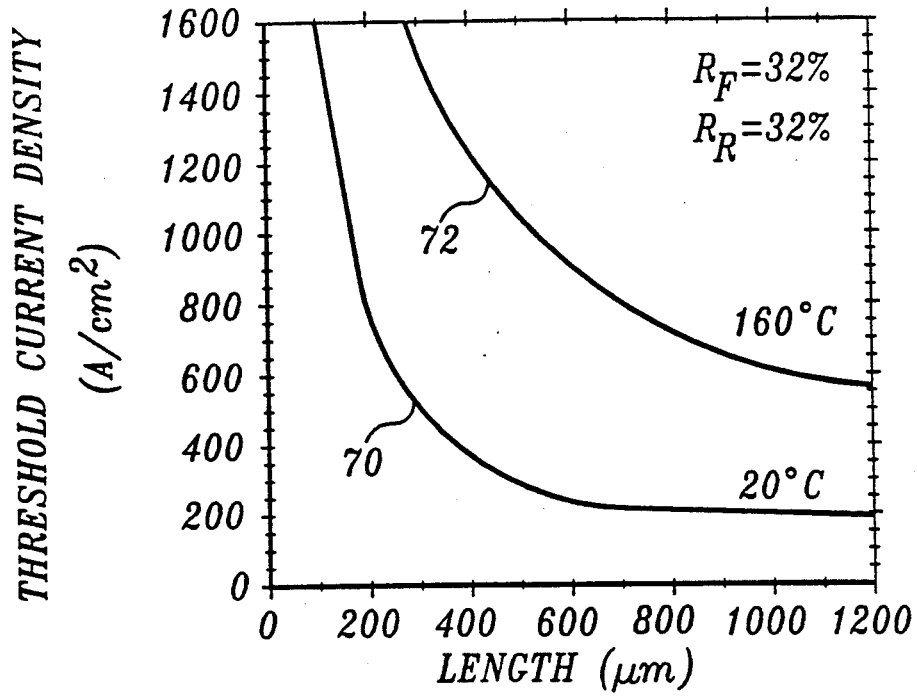
FIGS. 5A-5D are graphs illustrating the relationships between threshold current density, length, and facet reflectivity.

FIGS. 5A-5D illustrate the interrelationship between threshold current density, cavity length, temperature and facet reflectivity. Referring initially to FIG. 5A, curve 70 illustrates the theoretically determined relationship between threshold current density and cavity length, at 20° C., for a semiconductor laser of the type described above. Curve 72 illustrates this same relationship at 160° C. In FIG. 5A, both front and rear facets are uncoated, and thus have reflectivities of about 32%. As can be seen, there is a large fractional change, e.g., 300% or greater, in the threshold current density as one goes from 20° C. to 160° C. This is particularly true for the more conventional cavity lengths, i.e., those in the range 200-400 microns.

Figure 5B:
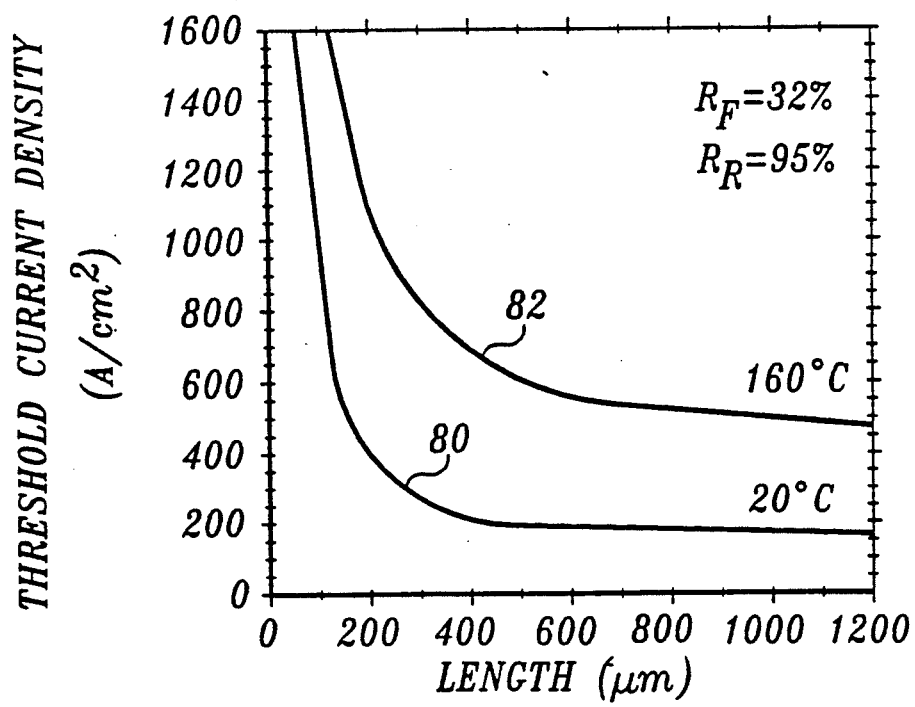

FIG. 5B illustrates a similar relationship for the case in which a high reflectivity coating (95%) is placed on the back facet. Curve 80 represents the threshold current density versus cavity length for such a laser at 20° C., and curve 82 represents a similar relationship at 160° C. Curve 82 indicates that for cavity lengths of about 500 microns or higher, there is significant reduction in the required threshold current density at elevated temperatures. In addition, for cavities of about 500 microns in length or greater, the fractional change in threshold current density between 20° C. and 160° C. is smaller than the corresponding fractional change illustrated in FIG. 5A.

Figure 5C:
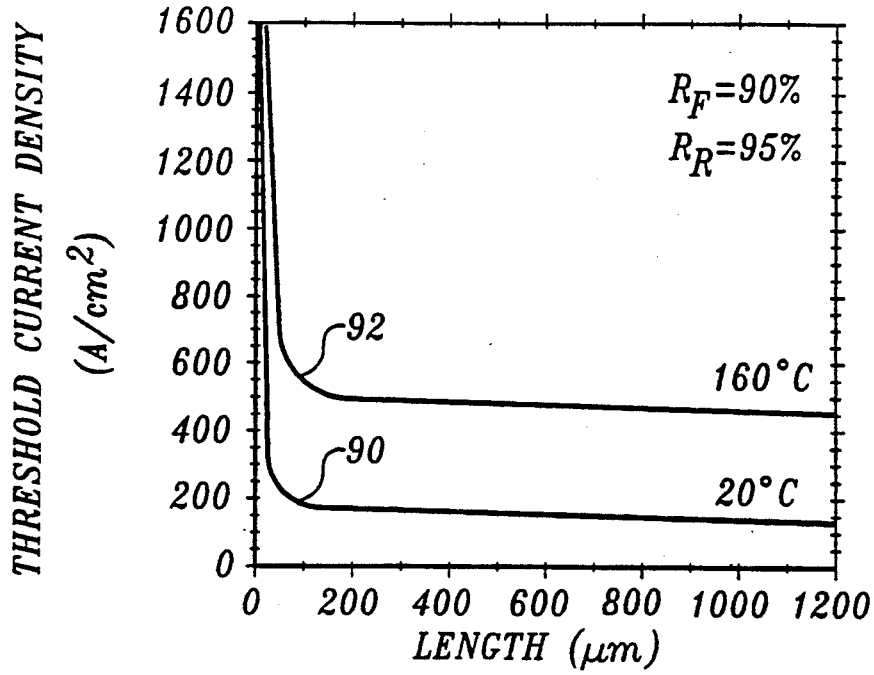

FIG. 5C illustrates the case in which the reflectivity of the back coating is kept at 95% while the reflectivity of the front coating is raised to 90%. Under these circumstances, for cavities of about 100 microns or greater, there is a relatively small change in threshold current density as one goes from 20° C. (curve 90) to 160° C. (curve 92).

Figure 5D:
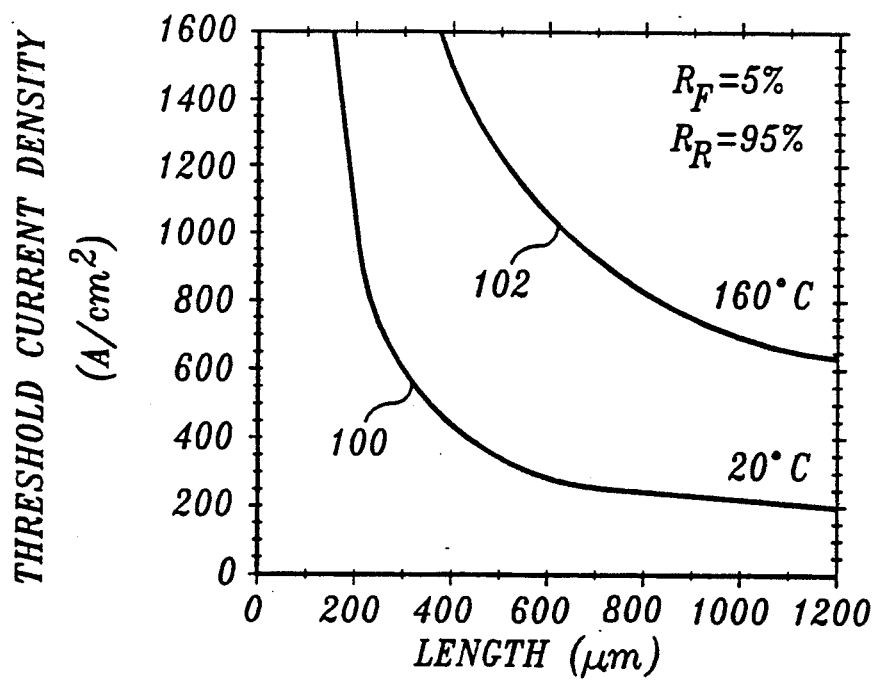

Finally, FIG. 5D illustrates the case in which the back facet reflectivity remains at 95%, while the reflectivity of the front facet is reduced to 5%. Such a low reflectivity might be required in some cases to produce high enough output power. However for such an embodiment, a cavity length of 800 microns or more, and preferably of 1000 microns or more, would be needed to minimize temperature dependence.

Collectively, FIGS. 5B-5D delineate the relationship between front facet reflectivity and cavity length, for the case in which the rear facet reflectivity is 95%. Thus referring to FIG. 5C, for a front facet reflectivity of 90%, cavity lengths as short as 100-200 microns can be used. When the front facet reflectivity drops to 32% (FIG. 5B), the preferred cavity length is 500 microns or greater. Finally, for a front facet reflectivity of 5% (FIG. 5D), a cavity length of 800-1000 microns or higher would be preferred. In general, it is desirable to have a low threshold current density, with as short a laser cavity as possible, to minimize the threshold current and the electrical power consumption. The threshold current is the product of the threshold current density and the cavity length and width. However low threshold current density is extremely important, because of its correlation with heating effects. Without a high reflectivity coating on at least one end of the cavity, FIGS. 5A-5D illustrate that the laser cavity length required to minimize the threshold current density at 160° C. is longer than practical.

With rear and front facet reflectivities of 95% and 90%, respectively, the laser cavity length can be less than 200 microns. Such a structure will, however, have much lower external quantum efficiency, resulting in lower laser output power than a longer laser with a lower front facet reflectivity. The optimal combination of front facet reflectivity and laser cavity length will therefore depend upon the power requirements for a particular laser. Since the quantum efficiency decreases with increasing temperature, for many applications, the output power at high temperature with a front facet reflectivity of 90% will be too low. For example, for current density temperature dependence similar to that obtained with a 200 micron cavity and 90%/95% reflectivities, but with more power, a 600 micron cavity and 32%/95% reflectivities could be used. In spite of a high front facet reflectivity, the very high rear facet reflectivity of such a design results in higher output power from the front facet than would be obtained with uncoated facets. For very high power applications, longer laser cavities (e.g. 1000 microns) with low front facet reflectivity can be used. This would be at the expense of some compromise in threshold current density temperature dependence. It should be noted, however, that the threshold current density temperature dependence of such a device is still considerably better than that of a standard semiconductor laser (no facet coatings).

The external quantum efficiency at the front facet, $\eta_f$, is related to the internal quantum efficiency $\eta_i$ by $$\eta_f = \frac{\eta_i \frac{1}{2L} \ln \frac{1}{R_F}}{\alpha_i + \frac{1}{2L} \ln \frac{1}{R_F R_R}} \quad (2)$$

Figure 6:
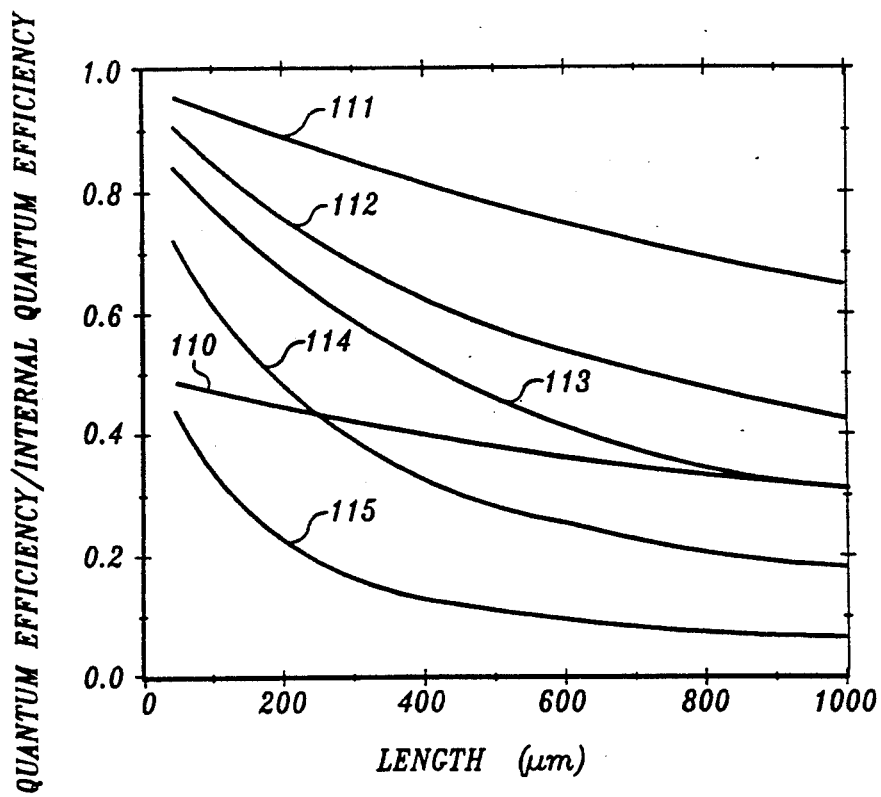
FIG. 6 is a graph illustrating the relationship between quantum efficiency and cavity length.

FIG. 6 illustrates the relationship between quantum efficiency and cavity length for semiconductor lasers of the type discussed above. Curve 110 represents a device in which neither facet is coated, i.e., both facets have reflectivities of about 32%. Curves 111-115 illustrate the relationships for back facet reflectivities of 95%, and front facet reflectivities of 5%, 32%, 50%, 70% and 90%, respectively. For all curves, it is assumed that the internal loss parameter $\alpha_i$ is equal to 8.1 $cm^{-1}$. In FIG. 6, the vertical axis is the normalized quantum efficiency ($\eta_f/\eta_i$), i.e., the quantum efficiency at the front facet of the device divided by the internal quantum efficiency. Normalized quantum efficiency is thus a measure of the fraction of photons created in the laser cavity that are emitted by the device. By extrapolation between curves 113 and 114, it may be seen that a high quantum efficiency, high temperature device can be obtained, for front facet reflectivities of up to 60%, by making the cavity length L equal to or larger than about 600 microns. Conversely, a device specifically designed for low electrical power consumption at high temperature can be obtained by using a front face reflectivity of at least 60%, and a cavity length L less than 600 microns.

Figure 7:
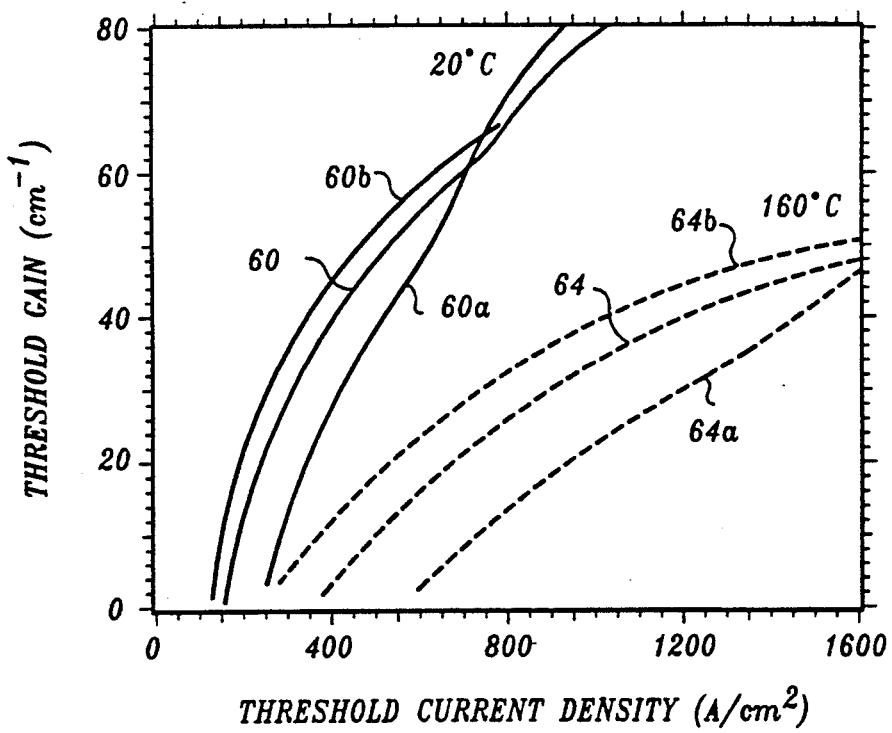
FIG. 7 is a graph illustrating the relationship between threshold gain, threshold current density, temperature, and indium fraction.

FIG. 7 presents the results of modeling the effects of different amounts of strain (i.e. indium) in the quantum well on the temperature dependence of the device. In particular, FIG. 7 is similar to FIG. 4, and illustrates the threshold gain versus threshold current density for different indium fractions at two different temperatures. Curves 60 and 64 from FIG. 4 are reproduced, these curves representing the theoretical relationships between threshold gain and threshold current density at temperatures of 20° C. and 160° C. respectively. Both of these curves are for indium fractions of 0.15. At 20° C., curves 60a and 60b represent the relationship at indium fractions of 0.1 and 0.2 respectively. Similarly, curves 64a and 64b represent the relationships at 160° C., for indium fractions at 0.1 and 0.2, respectively. The model suggests that more strain, i.e., more indium, will decrease the temperature sensitivity of the laser. The maximum indium concentration that is practical is limited to that which will not cause the structure to relax or otherwise degrade the quality of the epitaxial growth, while the minimum indium fraction is that required to produce a useful amount of strain. Suitable indium fractions are those in the range 5–30%. In general, as the indium concentration is increased, it will generally be necessary to decrease the thickness of the InGaAs quantum well. For small or moderate amounts of strain, i.e. for indium fractions of 5–20%, preferred thicknesses for the quantum well are in the range 60–100 Å. For higher amounts of strain, thinner quantum wells (e.g. 60–80 Å) would be generally preferred. Selecting the proper indium fraction will therefore involve tradeoffs with other device parameters.

The model illustrated in FIG. 7 does not take into account the effects on the internal quantum efficiency temperature dependence which results from changing the amount of strain. If the internal quantum efficiency temperature dependence is determined by Auger recombination or carrier leakage over heterostructure barriers, then more strain will result in improved quantum efficiency at high temperatures. A wider quantum well should also reduce Auger recombination as a result of the lower carrier density and improve quantum efficiency at high temperature.

Figure 8A:
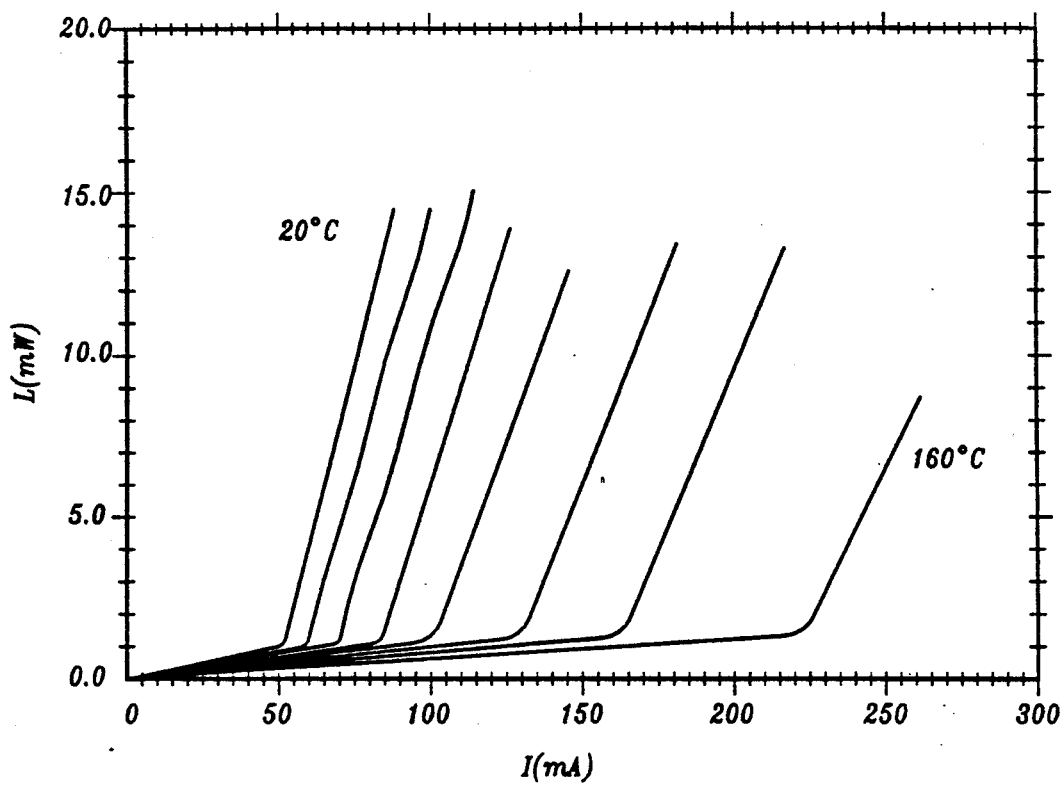
FIGS. 8A and 8B are graphs illustrating the relationship between light output power, current, and temperature for two different cavity lengths.
Figure 8B:
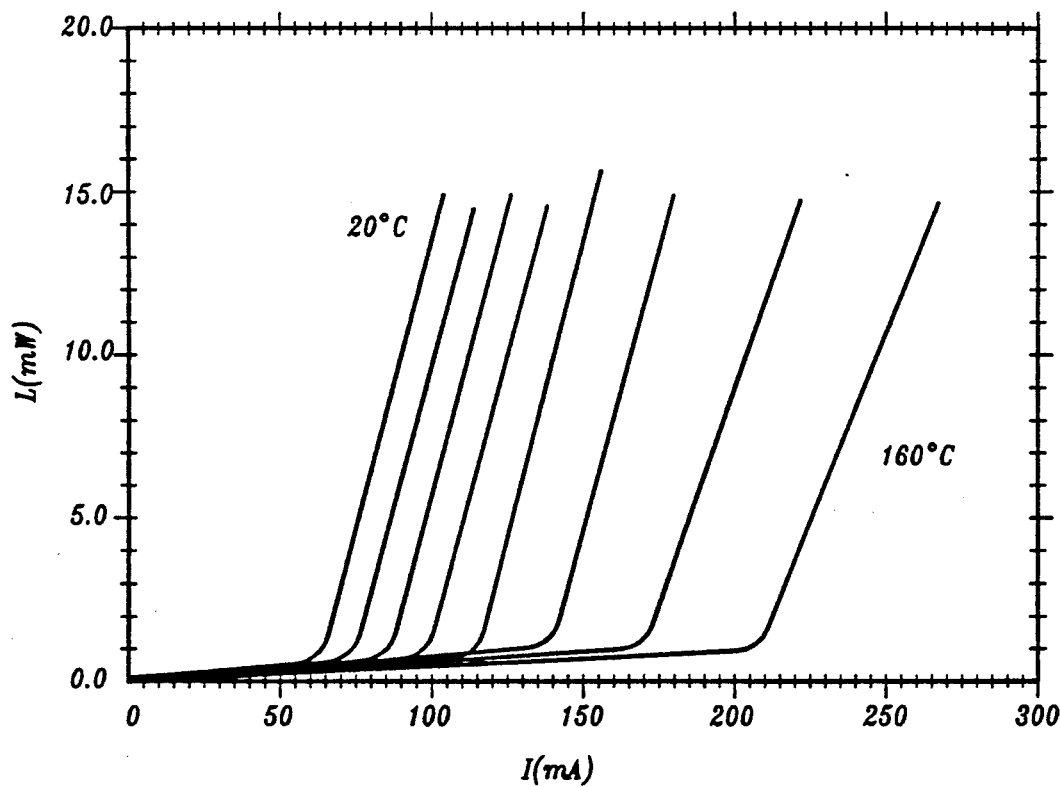
Figure 9:
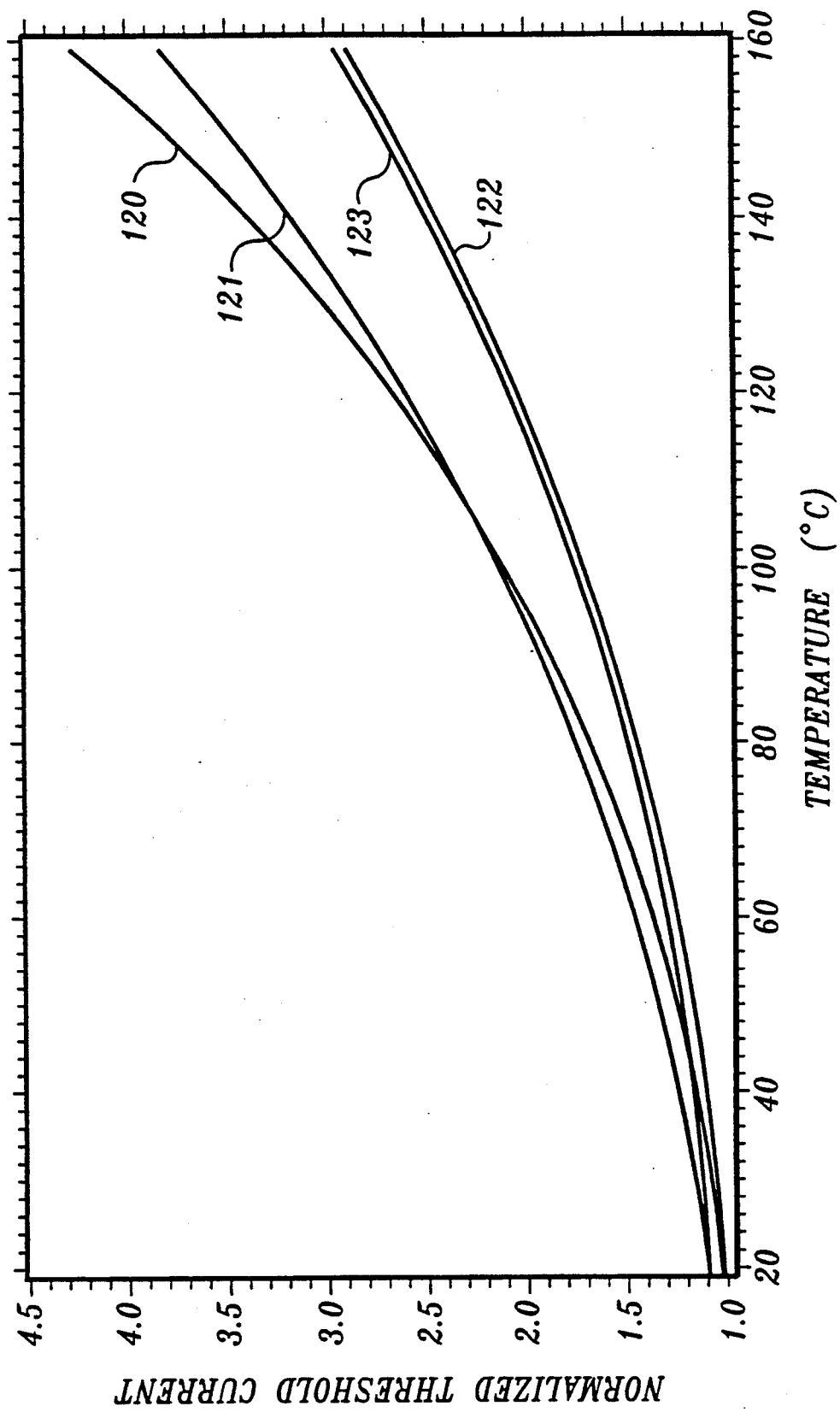
FIG. 9 is a graph illustrating the relationship between normalized threshold current, temperature, and cavity length.

In order to test the validity of the models used above, a series of broad area laser diodes of the type shown in FIGS. 2 and 3 were fabricated, with 50 micron widths, 60 Å thick quantum wells, and indium fractions of 0.15. The front and rear facet reflectivites were both 32%. The devices were fabricated with cavity lengths of 400 and 1600 microns, and the pulsed operating characteristics of the device are summarized in FIGS. 8A and 8B, from 20° C. to 160° C., in 20° C. increments. These figures clearly indicate that the longer cavity device (FIG. 8B) has lower threshold gain, lower threshold current density, and better high temperature operating characteristics than the shorter cavity device (FIG. 8A). FIG. 9 presents the data shown in FIGS. 8A and 8B in a different format, that more clearly shows the relationship between cavity length and temperature dependence. In FIG. 9, the horizontal axis is temperature, and the vertical axis is the normalized threshold current, i.e., the threshold current at a given temperature divided by the threshold current at 20° C. In FIG. 9, curves 120–123 correspond to cavity length of 400, 800, 1200, and 1600 microns, respectively. Curves 122 and 123 clearly show the decreased temperature sensitivity for the longer cavity lengths.

Figure 10:
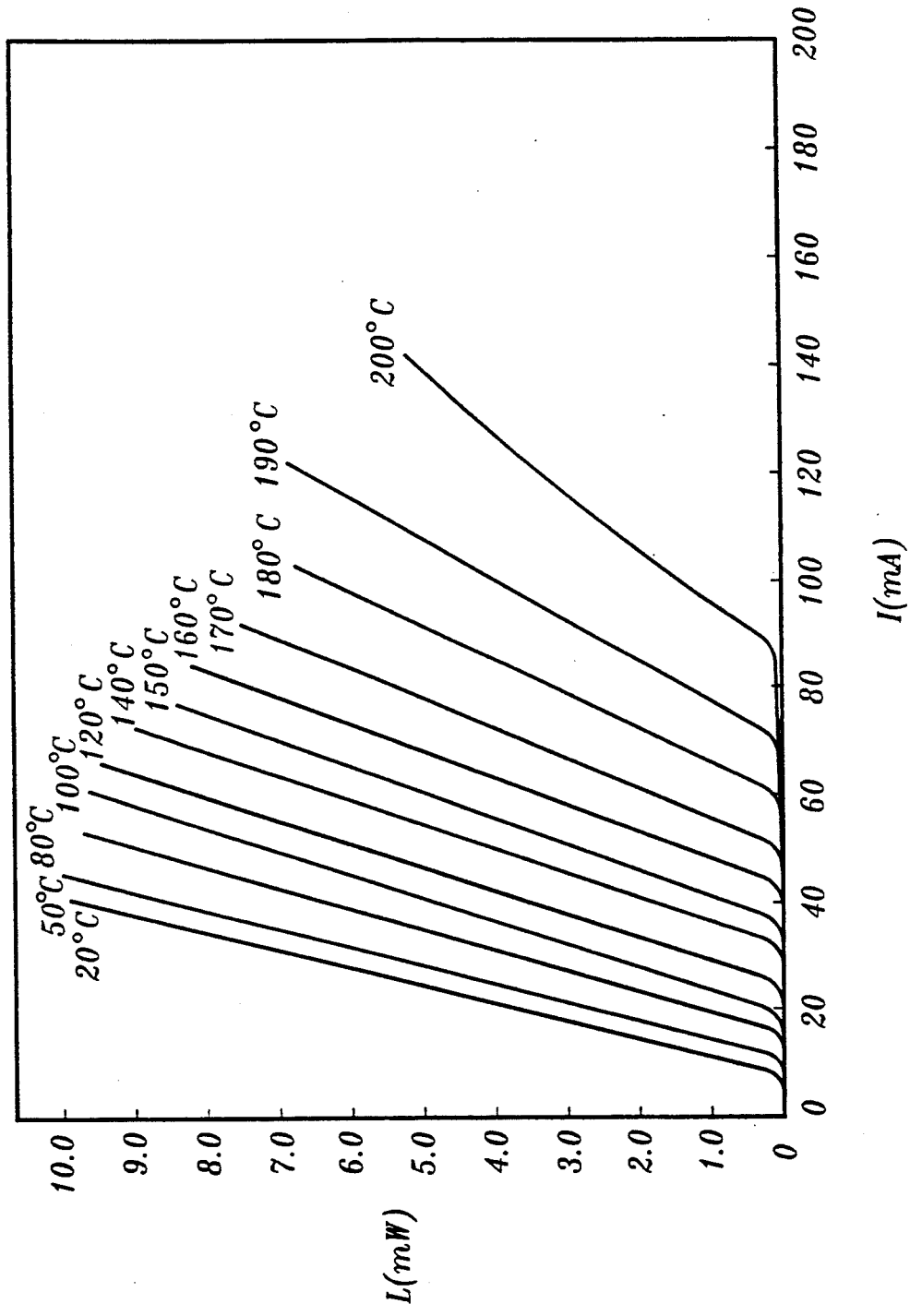
FIG. 10 is a graph illustrating the relationship between light output power, current, and temperature.

To demonstrate the capabilities of the semiconductor lasers of the present invention, ridge devices of the type shown in FIGS. 1 and 2 were fabricated having 3 micron wide ridge portions, 60 Å quantum wells with indium fractions of 0.2, cavity lengths of 800 microns, and facet reflectivities of 95% and 5%. FIG. 10 shows the relationships between light output and current input for such devices as a function of temperature for continuous wave (CW) operation. The devices emitted over 5 mW at 200° C. If a higher reflectivity front facet coating were used to obtain lower threshold gain, even higher temperature operation could be obtained, but at a lower output power.

Figure 11:
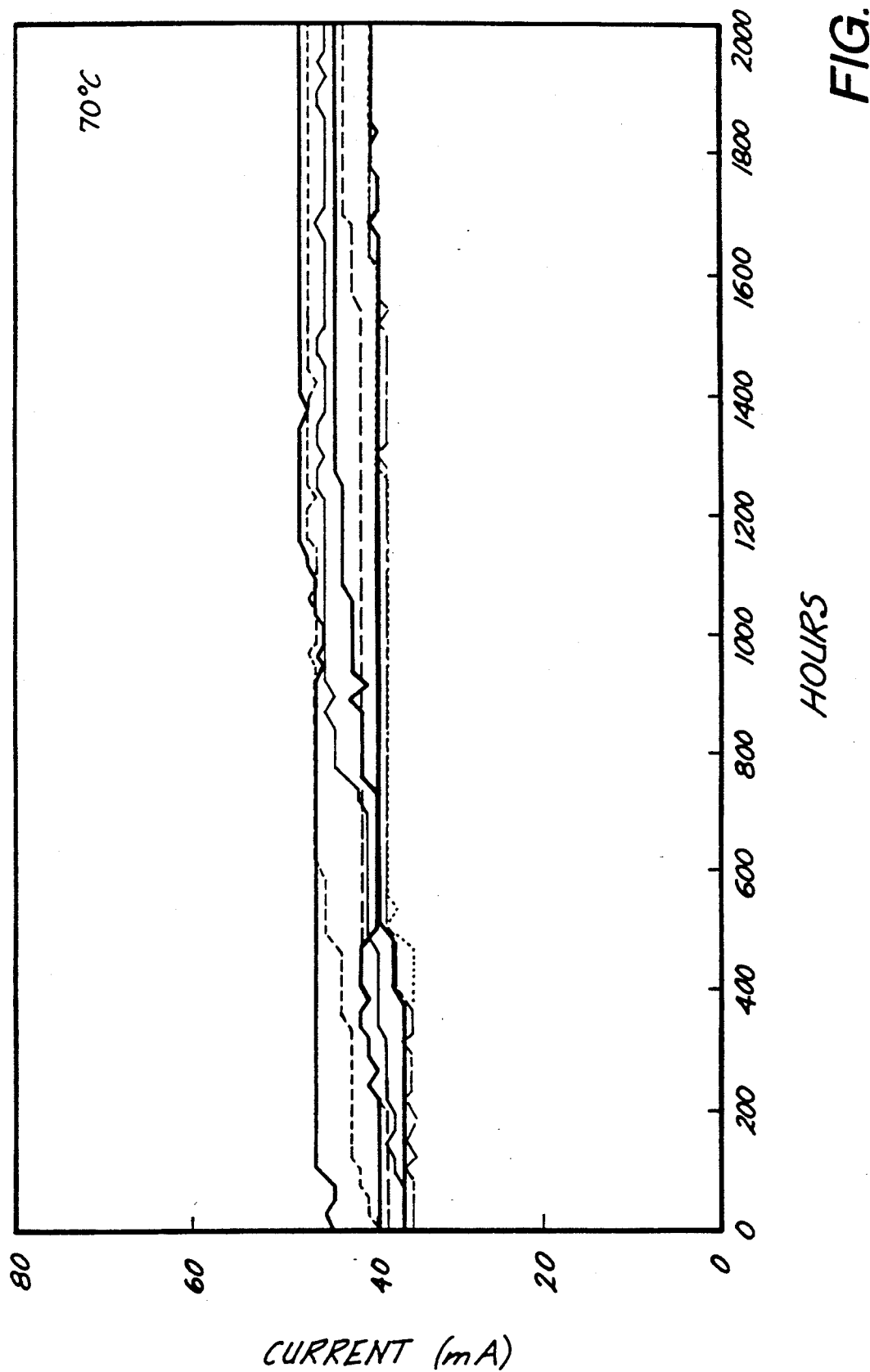
FIGS. 11-13 are graphs illustrating reliability tests of laser diodes constructed in accordance with the present invention, at temperatures of 70° C., 100° C. and 125° C., respectively.
Figure 12:
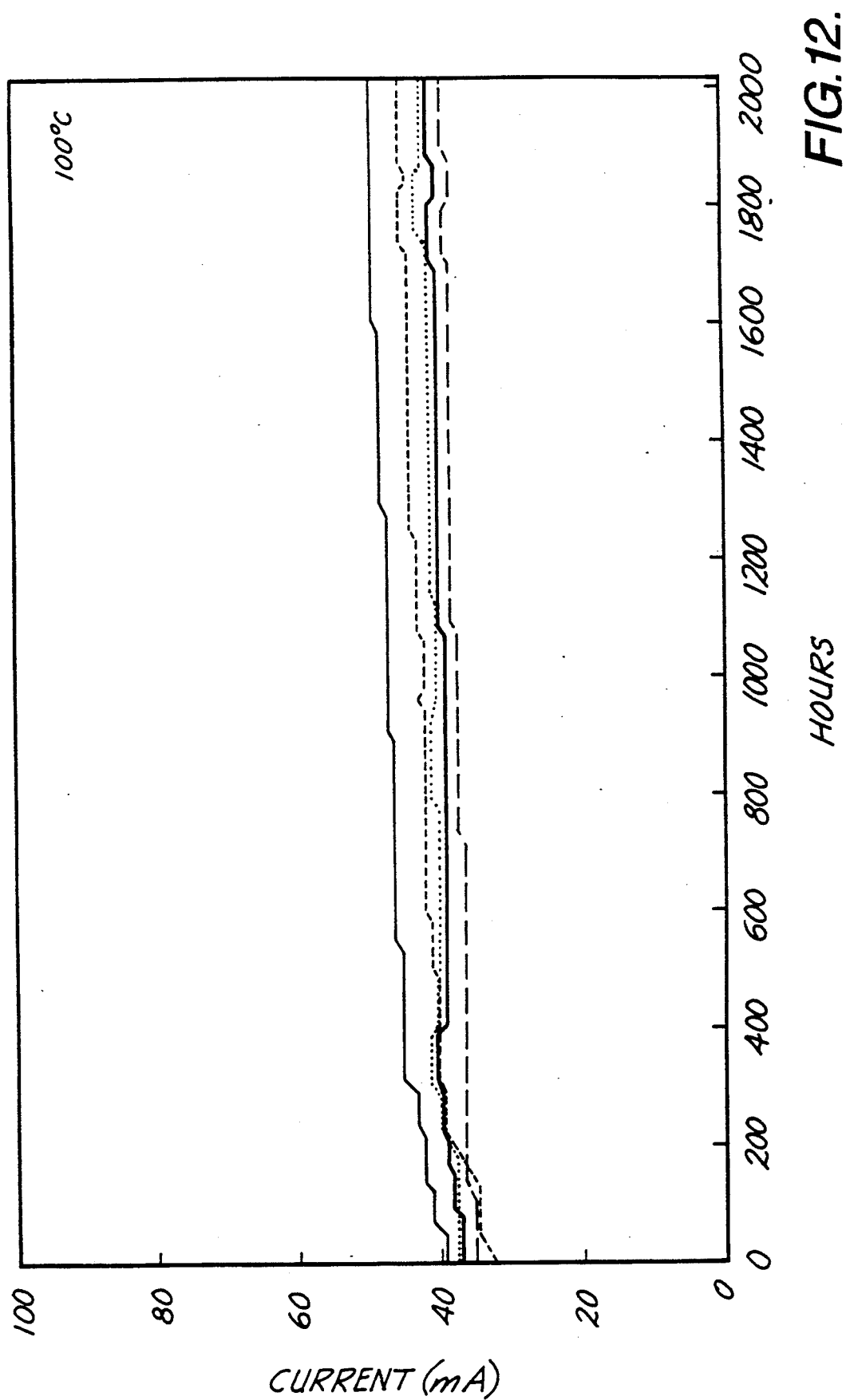
Figure 13:
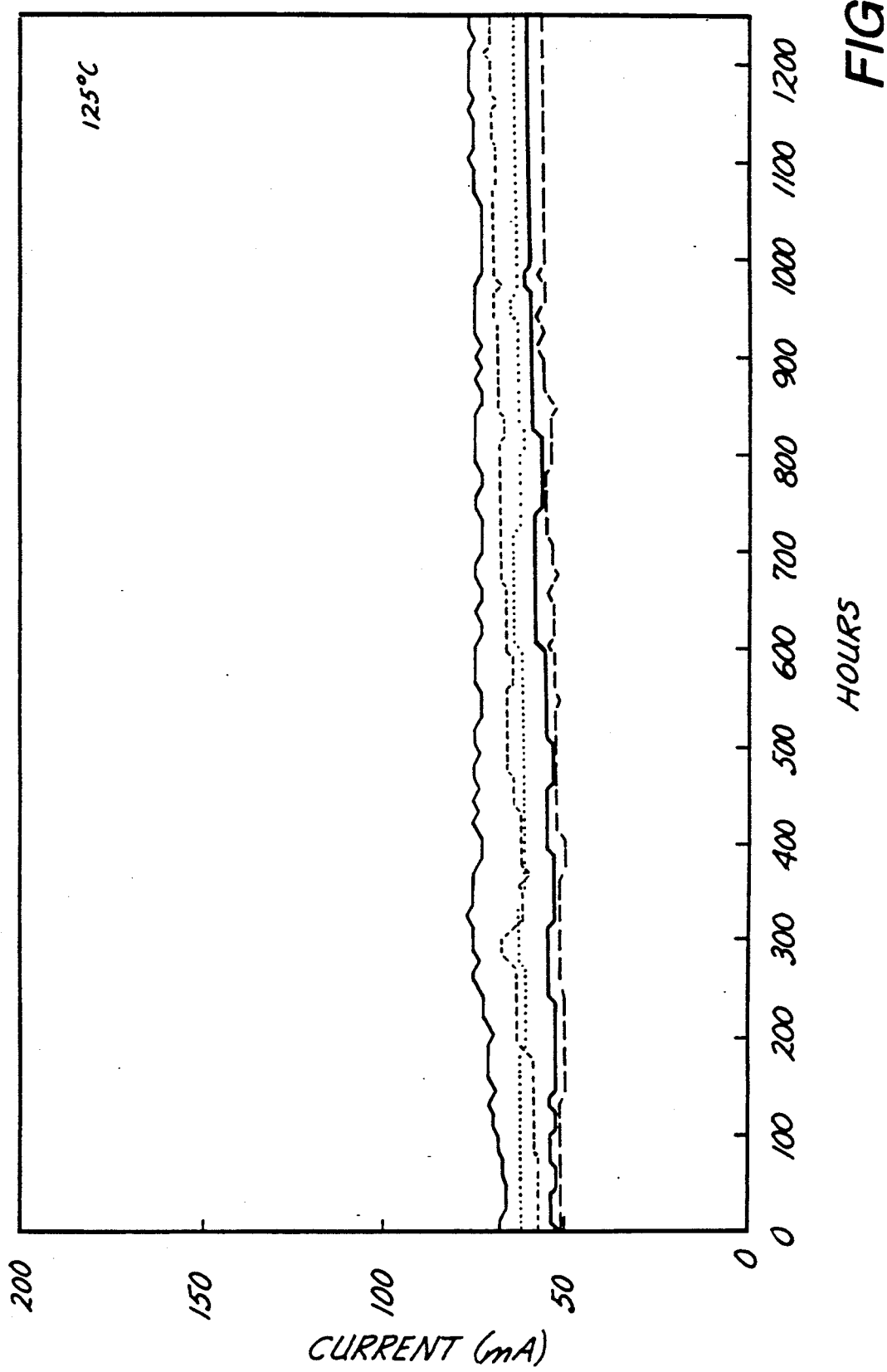

FIGS. 11–13 illustrate the reliability of such lasers, at an output power of 10 mW, and at temperatures of 70° C., 100° C. and 125° C., respectively. This data demonstrates that the lasers of the present invention are capable of operating reliably at temperatures of at least 100° C. for 2000 hours or more. In general, a semi-conductor laser is considered to be no longer operating when its current has doubled. FIGS. 11 and 12 demonstrate a degradation rate (fractional change of current per unit time) of only about $10^{-4}$/hour at 70° C. and 100° C. The test at 125° C. is ongoing, and so far demonstrates a degradation rate of about $10^{-4}$/hour up to 1200 hours.

While the preferred embodiments of the invention have been illustrated and described, numerous variations will be apparent to those skilled in the art. For example, multiple quantum well devices may be fabricated using the principles of the present invention, although in general they will have higher threshold current densities, and therefore more temperature dependence, than single quantum well devices. However, multiple quantum well lasers have higher modulation bandwidths than single quantum well lasers, and so might be preferred for high speed applications at high temperatures.

The embodiments of the invention in which an exclusive property or privilege is claimed are defined as follows:

1. A semiconductor laser, comprising:
   a substrate on which is defined a layered semiconductor structure including an active region of length L, the active region comprising a quantum well surrounded by optical confining layers, and cladding layers;
   first and second electrodes through which an electrical current flows to excite the active region;
   the active region further comprising front and rear faces, the rear face having a high reflectivity coating thereon, the length L and the reflectivity R of the front end face being selected as a function of a threshold carrier density and a desired operating temperature of up to 100° C., as determined by computer modeling the operation of the laser so as to minimize a plurality of parameters, including:
   (a) a threshold current density;
   (b) the length;
   (c) a threshold current; and
   (d) power consumption;
   said plurality of parameters (a) through (d) being minimized and selected consistent with achieving a design output power at the desired operating temperature, such that the laser is capable of operating reliably and producing the design output power at the desired operating temperature for at least 2000 hours.

2. The laser of claim 1, designed for high quantum efficiency at high temperature, wherein the front face has a reflectivity of not more than 60%, and wherein the length L of the active region is at least 600 microns.

3. The laser of claim 1, designed for low electrical power consumption at high temperature, wherein the front face has a reflectivity of at least 60%, and wherein the length L of the active region is in the range of 100–600 microns.

4. The laser of claim 1, wherein the rear face has a reflectivity of at least 95%.

5. The laser of claim 1, wherein the front face has a reflectivity of about 32%, and wherein the length L of the active region is at least 500 microns.

6. The laser of claim 1, wherein the front face has a reflectivity of about 90%, and wherein the length L of the active region is at least 100 microns.

7. The laser of claim 1, designed for high output power, wherein the front face has a reflectivity of about 5%, and wherein the length L of the active region is at least 800 microns.

8. The laser of claim 1, wherein the active region contains a single quantum well.

9. The laser of claim 1, wherein the fraction of indium in the active layer is in the range of 5–30%.

10. The laser of claim 9, wherein the thickness of the quantum well is in the range of 60–100 Å.

11. The laser of claim 8, wherein the fraction of indium in the quantum well is in the range of 20–30%, and the thickness of the quantum well is in the range of 60–80 Å.

* * * * *